United States Patent [19]
Offermanns

[11] 4,329,653
[45] May 11, 1982

[54] CIRCUIT ARRANGEMENT FOR STORING THE PHASE OF AN A-C VOLTAGE

[75] Inventor: Walter Offermanns, Berlin, Fed. Rep. of Germany

[73] Assignee: Siemens Aktiengesellschaft, Munich, Fed. Rep. of Germany

[21] Appl. No.: 125,399

[22] Filed: Feb. 27, 1980

[30] Foreign Application Priority Data

Feb. 27, 1979 [DE] Fed. Rep. of Germany ....... 2907682

[51] Int. Cl.³ .......................... H03L 7/00; H03B 1/04
[52] U.S. Cl. ............................... 328/155; 307/200 A; 307/511; 361/68
[58] Field of Search ........................ 307/200 A, 511; 328/155; 361/68, 81; 340/310 A

[56] References Cited

U.S. PATENT DOCUMENTS 4,079,435 3/1978 Zaslavskaya et al. ........... 361/68 X
4,152,656 5/1979 Udvardi-Lakos ................... 328/155
4,208,594 6/1980 Guicheteau ..................... 307/200 A Primary Examiner—John S. Heyman
Attorney, Agent, or Firm—Kenyon & Kenyon

[57] ABSTRACT

A circuit arrangement for storing the phase of an a-c voltage which stores the original phase with certainty even if the a-c voltage disappears or in the event of an abrupt change of the phase, in which two monostable multivibrators have outputs which are connected to each other via logic circuits. The logic circuits also having as inputs pulses corresponding to the negative and positive half waves of the a-c voltage, with a control arrangement controlled by the a-c voltage coupled to the logic circuits to control which of the two sets of inputs is effective to trigger the monostable multivibrators.

8 Claims, 3 Drawing Figures

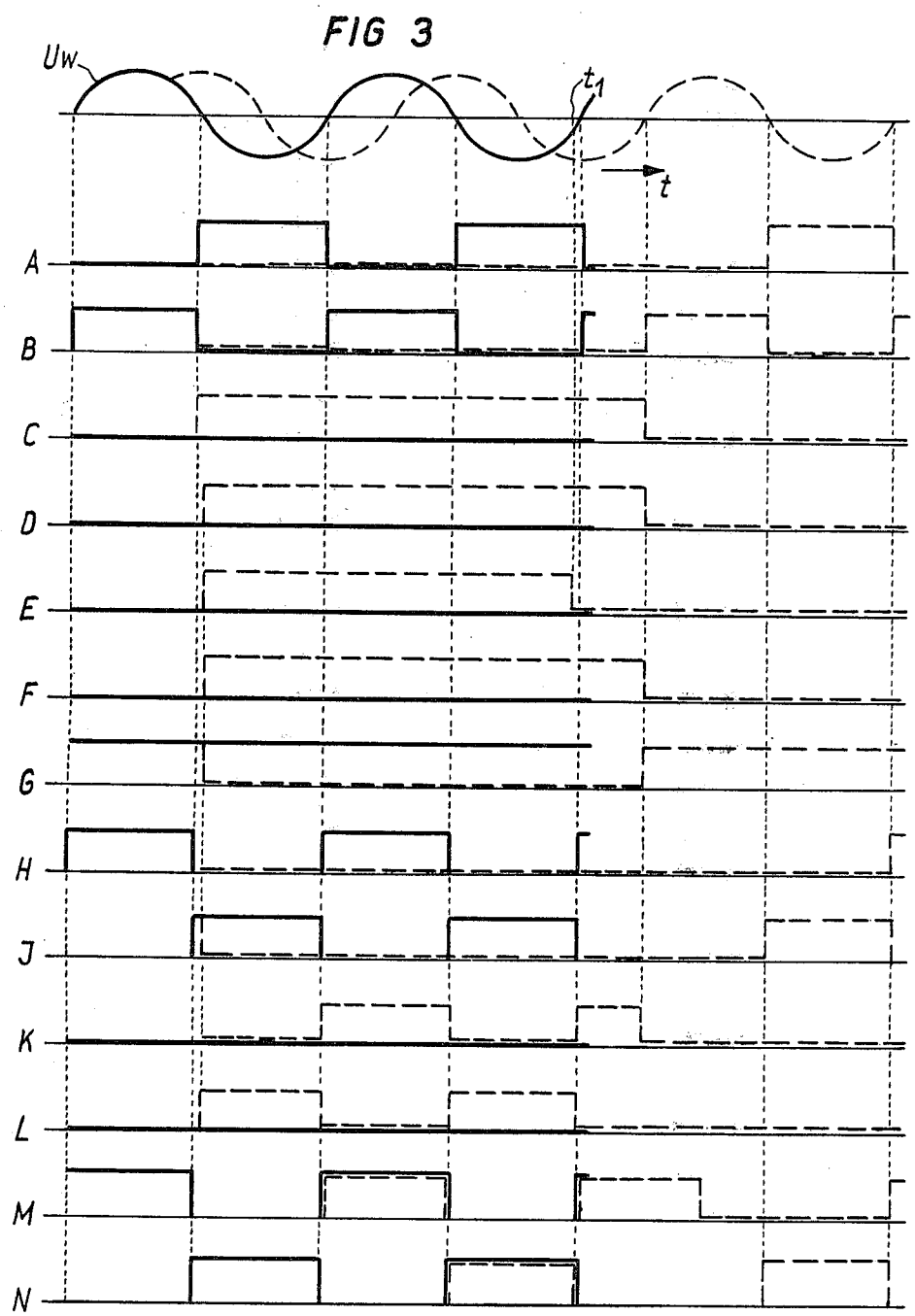

CIRCUIT ARRANGEMENT FOR STORING THE PHASE OF AN A-C VOLTAGE

BACKGROUND OF THE INVENTION

This invention relates to electrical measurements in general and more particularly to an improved circuit arrangement for storing the phase of an a-c voltage.

Circuit arrangements for storing the phase of an a-c voltage are employed, among other things, in equipment for the protection of electric power transmission lines. For instance, such storage is used where it is necessary to reliably determine the direction of the location of a short circuit as seen from the place of installation of the equipment. Two measurement quantities are required for this direction determination, namely, for instance, current and voltage in the event of a short circuit at the place of installation of the equipment, so that conclusions as to the direction of the short circuit can be drawn from their phase difference. The determination of the direction then depends on the fact that a short circuit voltage is also present in the event of a short circuit at the place of installation of the equipment.

This condition is not always fulfilled, so that one endeavors to utilize, in a polyphase power transmission, voltages of those phases which are not involved in the short circuit. However, since in certain fault cases, such voltages "removed from the short circuit" are not present either, circuit arrangements for storing the phase of the short circuit voltage are used. Known circuit arrangements of this type (Siemens Catalog R2, 1978 "Conventional Protective Apparatus and Relays," page 5/45) consist of tuned circuits which maintain the phase prior to the occurrence of the short circuit for a time long enough, during the decay of the voltage, to determine the direction, even if the voltage at the power transmission system to be monitored breaks down completely.

The use of circuit arrangements consisting of tuned circuits for storing the phase of an a-c voltage presents difficulties especially if a reversal of the polarity of the voltage must be expected in the event of a short circuit. This applies, for instances, to power transmission lines with series capacitors if the short circuit occurs behind a capacitor, since in this case the tuned circuit must be decoupled from the voltage as fast as possible so that the voltage does not pull it into a false synchronism.

It is thus an object of the present invention to provide a circuit arrangement for storing the phase of an a-c voltage which ensures that the original phase is stored, even if the a-c voltage disappears and even if its phase is changed suddenly.

SUMMARY OF THE INVENTION

To solve this problem, a circuit arrangement for storing the phase of an a-c voltage, according to the present invention, contains a monostable multi-vibrator which delivers a squarewave pulse train corresponding to the positive half waves of the a-c voltage at its output, and a further monostable multivibrator which generates a further squarewave pulse train corresponding to the negative half waves of the a-c voltage at its output. The output of the further monostable multivibrator is connected via a logic circuit to the input of the one monostable multivibrator, and the output of the one monostable multivibrator is connector via a further logic circuit to the input of the further monostable multivibrator.

During normal operation, the a-c voltage is applied to the logic circuits and triggers the monostable multivibrators. If the phase changes, a control arrangement which is controlled by the a-c voltage provides inputs to the logic circuit causing it pass the square-wave pulses at the output of the monostable multivibrators as triggering inputs.

The circuit arrangement according to the present invention thus operates so that the monostable multivibrators, under the control of the control arrangement, are removed from the influence of the a-c voltage if the phase of the a-c voltage changes and then continue to generate at their outputs, for a predeterminable time, so to speak, under internal control, squarewave pulse trains, the phase of which agrees with the squarewave pulse trains generated prior to the switching to internal control. This is achieved by having the control arrangement switch the logic circuits preceding the monostable multivibrator so that they pass only the squarewave pulses which are fed from the output of the respective one monostable multivibrator to the input of the respective other monostable multivibrator. The internal control of the circuit arrangement, i.e., the generation of squarewave pulse trains uninfluenced by the a-c voltage at the outputs of the monostable multivibrators, can last as long as desired; in general the duration of the internal control is given by the measurement problem on hand. In the case of an application of the circuit arrangement according to the present invention in equipment for protecting an electric power transmission system, it is generally chosen long enough that the determination of the direction of the short circuit is reliably completed.

One advantage of the circuit arrangement according to the present invention is that it permits storing the phase of the a-c voltage sufficiently long even if the a-c voltage disappears. A further advantage is seen in the fact that arbitrary changes of the phase of the a-c voltage do not influence the storing of the phase in an interfering manner, i.e., in any event the stored phase always corresponds exactly to the phase of the a-c voltage before it changed.

A further advantage of the circuit arrangement according to the present invention consists in that, because the one logic circuit is addressed by pulses corresponding to the negative half waves of the a-c voltage, and the further logic circuits are addressed by pulses corresponding to the positive half waves of the a-c voltage, by the end of the last positive or negative pulse generated prior to the change of the phase, if the phase of the a-c voltage changes suddenly, a further pulse is generated either at the output of the one or the further monostable multivibrator, which pulse follows exacty upon the squarewave pulse train; parallel in time, the change of the phase of the a-c voltage can be determined and the arrangement including the logic circuits and the monostable multivibrators can be switched to internal control. The squarewave pulse trains therefore appear in unchanged form at the output of the monostable multivibrators and continue without interruption in spite of the changed phase.

The logic circuits as well as the control arrangement of the circuit arrangement according to the present invention can be designed in different ways; the presently available digital circuit devices offer many embodiment possibilities therefor. In the interest of a circuit design which is as simple as possible, is clear-cut and reliable, however, it appears advantageous if each logic circuit consists of two AND gates and an OR gate connected thereto. The pulses corresponding to the negative half-waves of the a-c voltage are applied to the one input of the one AND gate of the one logic circuit, and the pulses corresponding to the positive half-waves of the a-c voltage are applied to the one input of the one AND gate of the further logic circuit. An output of the circuit arrangement is connected to the other input of the respective one AND gate and the one input of the respective other AND gate is connected to the further output of the control arrangement and the other input of the respective AND gate is connected to the output of the monostable multivibrator not connected thereto.

To determine changes in the phase of the a-c voltage and to influence the control arrangement accordingly, it is advantageous if the control arrangement is preceded by a monitoring circuit which delivers a control signal its at output which is fed to the control arrangement if the phase of the a-c voltage present at its input changes. To generate the control signal, the monitoring circuit may be designed in different ways. However, it is considered advantageous if the monitoring circuit contains an additional monostable multivibrator which delivers pulses corresponding to the negative half waves of the a-c voltage at its output and a further additional monostable multivibrator which generates further pulses corresponding to the positive half waves of the a-c voltage at its output. A coincidence stage, the output of which is connected to an input of the control arrangement, is connected to the outputs of the two additional monostable multivibrators.

The pulses which are to be fed to the two logic circuits of the circuit arrangement according to the present invention and which correspond to the respective half waves of the a-c voltage, can be generated by means of supplemental monostable multivibrators, the inputs of which are connected to the a-c voltage. For simplifying the circuit it appears more advantageous, however, if the output of the one additional monostable multivibrator is connected to the one input of the one AND gate of the one logic circuit and the output of the further additional monostable multivibrator is connected to the one input of the one AND gate of the further logic circuit. In that case no supplemental monostable multivibrators are required since the additional monostable multivibrators are used at the same time for generating the pulses corresponding to the half waves of the a-c voltage.

The control arrangement of the circuit arrangement according to the present invention can be designed in different ways. To obtain a storage effect for the signal generated by the monitoring circuit if the phase changes, it contains advantageously, however, a bistable multivibrator, the two outputs of which are connected to the AND gates of the logic circuits.

In order to ensure that at the end of the time provided for storing the phase of the a-c voltage, the logic circuit can again be controlled by the pulses at the outputs of the monostable multivibrators, the outputs of the two additional monostable are advantageously connected via an additional OR gate to one input of the bistable multivibrator so that the latter is reset.

Since the length of the signal present at the output of the coincidence stage is dependent on the change of the phase of the a-c voltage, but the storage by the phase of the a-c voltage is to be maintained for a period of time required for measurement reasons, it is advantageous to provide a time determining monostable multivibrator at the input of the control arrangement. The duration of the output pulse of this monostable multivibrator, because the output of the time determining monostable multivibrator is connected to the resetting inputs of the two additional monostable multivibrators, determines the period during which the bistable multivibrator must not be reset, i.e., the original phase of the a-c voltage is stored.

In order to also determine negligibly small changes of the phase or small frequency deviations of the a-c voltage by the monitoring circuit, it is considered advantageous to arrange a time delay stage in series with the coincidence stage and the time determining multivibrator.

BRIEF DESCRIPTION OF THE DRAWINGS

FIG. 3 is a series of diagrams helpful in understanding operation of the circuit arrangement of FIG. 2.

DETAILED DESCRIPTION OF THE INVENTION

Figure 1:
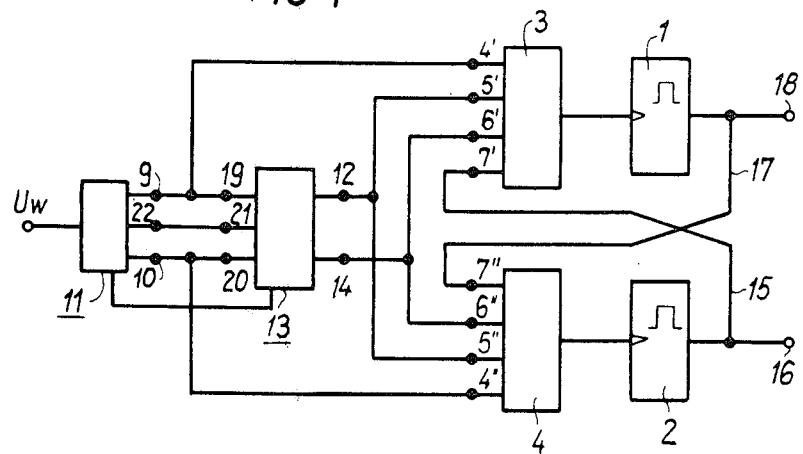
FIG. 1 is a block diagram of an embodiment of the circuit arrangement according to the present invention.

As can be seen from FIG. 1, the circuit arrangement for storing the phase of an a-c voltage Uw contains a monostable multivibrator 1 and a further monostable multivibrator 2. The multivibrators 1 and 2, for instance, can be designed as is described in the book by Tietze and Schenk, "Halbleiter-Schaltungstechnik" (semiconductor circuit engineering), 3rd. Edition, 1976, pages 303 and 304. The monostable multivibrator 1 is preceded by a logic circuit 3 and the further monostable multivibrator 2 is preceded by further logic circuit 4. The logic circuit 3 has inputs 4', 5', 6' and 7'; the logic circuit 4, which is designed like the logic circuit 3, has corresponding inputs 4", 5", 6" and 7". The inputs 4' and 4" are brought to outputs 9 and 10 of a monitoring circuit 11. The inputs 5' and 5" are connected to an output 12 of a control arrangement 13, while the inputs 6' and 6" of the logic circuits 3 and 4 are connected to a further output 14 of the control arrangement 13. The input 7' of the one logic circuit 3 is connected via a line 15 to the output 16 of further monostable multivibrator 2, while the input 7" is connected via a line 17 to the output 18 of monostable multivibrator 1. The outputs of the logic circuits 3 and 4 are connected directly to the inputs of the monostable multivibrators 1 and 2.

The control arrangement 13 has three inputs 19, 20 and 21. The inputs 19 and 20 are connected, like the inputs 4' and 4" of the logic circuits 3 and 4, to the outputs 9 and 10 of the monitoring circuit 11. The input 21 of the control arrangement 13 is connected to an additional output 22 of the monitoring circuit 11 and obtains a signal therefrom if the phase of the a-c voltage Uw changes.

Figure 2:
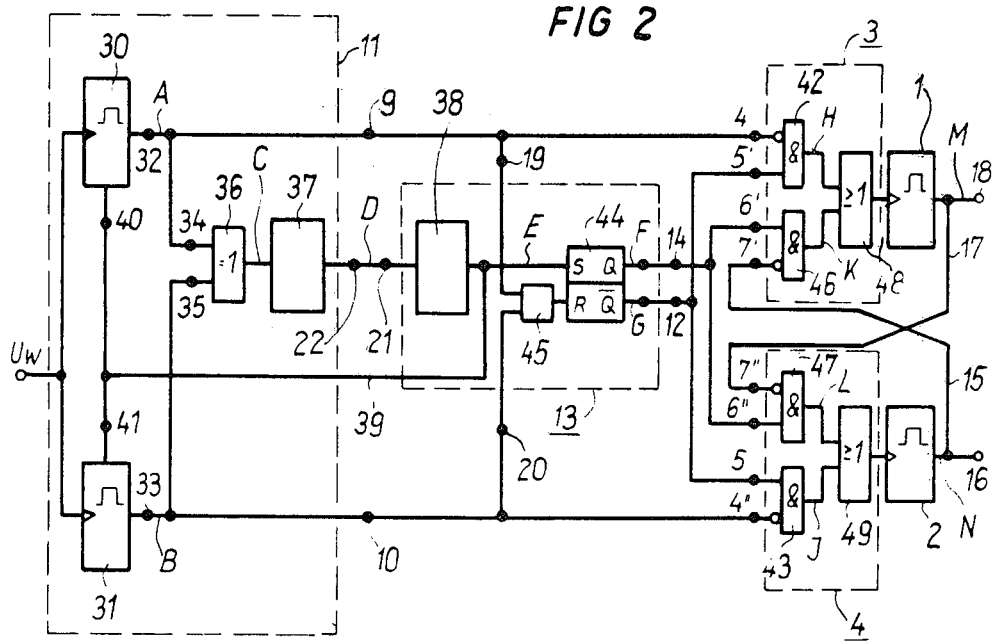
FIG. 2 is a circuit diagram showing further details of the embodiment according to FIG. 1.

The design of the embodiment according to FIG. 1, is shown in more detail in FIG. 2. As illustrated, the monitoring circuit 11 contains an additional monostable multivibrator 30 and a further additional monostable multivibrator 31, both having their inputs connected to the a-c voltate Uw. The outputs 32 and 33 of the two additional multivibrators 30 and 31 are brought to inputs 34 and 35 of a coincidence stage 36. The coincidence stage 36, which may be designed, for instance, as described in the book by Tietze and Schenk, "Halbleiter-Schaltungstechnik," 3rd edition, 1976, pages 489 and 490, is followed by a time delay stage 37 (for instance, in accordance with "Siemens-Datenbuch 1976/77", pages 468 to 470). The output of the time delay stage 37 forms the output 22 of the monitoring circuit 11.

The outputs 32 and 33 of the additional monostable multivibrators 30 and 31 are additionally brought to the outputs 9 and 10 of the monitoring circuit 11, so that the output variables of the additional monostable multivibrators 30 and 31 are present at the input 4' of the one AND gate 42 of the logic circuit 3 as well as at an input 4" of the one AND gate 43 of the further logic circuit 4.

At the input of the control arrangement 13, a time determining monostable multivibrator 38 is provided. The output of the time determining monostable vibrator 38 which in principle can be constructed like the multivibrators 1 and 2, is connected via a connection 39 to reset inputs 40 and 41 of the additional monostable multivibrators 30 and 31. Circuits which are identical with those of the multivibrators 1 and 2, with reset inputs, can be used as multivibrators 30 and 31.

The monostable 38 is followed by a bistable multivibrator 44 which can be designed, for instance, as an RS flip-flop (see Tietze and Schenk, "Halbleiter-Schaltungstchnik", 3rd edition 1976, pages 465 to 468). The flipflop is arranged so that its set input S is connected to the output of the monostable multivibrator 38 and its reset input R is connected via an OR gate 45 to the inputs 19 and 20 of the control arrangement 13. The Q output of the flipflop is connected to the output 14 of the control arrangement 13, and the $\overline{Q}$ output is connected to the output 12 of the control arrangement 13.

The output 12 is connected, respectively, to the inputs 5' and 5" which are connected respectively to AND gates 42 and 43 of the logic circuits 3 and 4. The output 14 is connected to the inputs 6' and 6" which are connected to AND gates 46 and 47, of the logic circuits 3 and 4. The inputs 7' and 7" which connect to AND gates 46 and 47 are connected via the lines 17 and 15 to the outputs 16 and 18 of the monostable multivibrators 1 and 2. The outputs of AND gates 42 and 46 are coupled through an OR gate 48 to the input of monostable multivibrator 1 and the outputs of AND gates 43 and 47 through an OR gate 49 to the input of monostable multivibrator 2.

To explain the operation of the circuit arrangement of the present invention as per FIG. 2, reference will be made to the pulse diagrams according to FIG. 3. The pulse diagrams are identified by upper case letters by which the corresponding points of the circuit in FIG. 2 are marked where these pulses appear.

It is initially assumed that the a-c voltage Uw has the phase indicated in the upper diagram. As a result, pulses A and B are generated at the circuit points A and B due to the additional monostable multivibrators 30 and 31, as is shown in solid lines in diagrams A and B of FIG. 3. No pulse appears at the output of the coincidence stage 36; this is shown in diagram C. Correspondingly, there are no pulses either at the circuit points D and E following the time delay stage 37 and the time determining monostable multivibrator 38. Also the S input of the bistable multivibrator 44 is then not addressed by a pulse, so that its Q output remains its output level of zero (see diagram F). At the circuit point G, on the other hand, which represents the output $\overline{Q}$ complementary to Q, a signal is obtained (diagram G). Under these conditions the pulses shown in diagram H are obtained at the output of the one AND gate 42, and the pulses shown in diagram J at the output of the one AND gate 43. No pulses appear at the outputs of the respective other AND gates 46 and 47 of the logic circuits 3 and 4, on the other hand, so that squarewave pulse trains marked with N and M appear at the outputs 16 and 18 of the monostable multivibrators 1 and 2; M coincides exactly with the phase of the voltage Ux, and N is exactly in phase opposition thereto.

If the phase of the voltage Uw changes abruptly and has the waveform shown in FIG. 3 by broken lines, then the conditions shown by broken lines in diagrams A and B are obtained at the outputs of the additional monostable multivibrators 30 and 31, and the pulse shown with broken lines in diagram C is generated at the output of the coincidence stage. This pulse C is passed on via the time delay stage 37 with some delay and is transformed into a signal E in the time determining multivibrator 38. This signal reaches the S input of the bistable multivibrator 44 and leads to a signal change (diagram F) at the Q output thereof and therewith, at the output 14 of the control arrangement 13. The signal at the $\overline{Q}$ output and at the output 12 of the control arrangement 13 changes correspondingly (diagram G). This cuts off the AND gates 42 and 43 so that from this instant on no signal is present at their outputs (see diagrams H and J). At the output of the other AND gate 46, on the other hand, squarewave pulses with a time sequence are now generated as was the case, the phase unchanged, at the output of the AND gates 42 and 43, because now the squarewave pulses can be mutually fed back from the output of the monostable multivibrators 1 and 2 via the connections 15 and 17 and arrive at the inputs of these monostable multivibrators. The pulses, shown by dashed lines in diagrams M and N, show that pulses, the phase of which agrees with the a-c voltage in the unchanged phase, are generated even if the phase of the a-c voltage Uw is changed.

The pulse E of the time determining multivibrator 38 also addresses the reset inputs of the additional monstable multivibrators 30 and 31, and thereby, defined starting conditions are created for switching control of the monostable multivibrators 1 and 2 back to the a-c voltage Uw. This is accomplished in such a manner that at the time t1, i.e., at the end of the running period of the time determining monstable multivibrator 38, the resetting signal for the additional monostable multivibrators 30 and 31 is cancelled, so that they are controlled by the half waves of the a-c voltage Uw occurring at the time t1 and deliver the pulses shown by broken lines in diagrams A and B at their outputs 32 and 33. The first pulse at the output 33 resets the bistable multivibrator 44, so that its output Q signal now disappears (diagram F) and $\overline{Q}$ appears (diagram G). This cuts of the respective AND gates 46 and 47 and the respective AND gates 42 and 43 are enabled, so that from then on the monostable multivibrators 1 and 2 are controlled from the respective first pulse of the two additional monostable multivibrators 30 and 31 (diagrams H to N).

With the present invention, a circuit arrangement for storing the phase of an a-c voltage which allows storing the original phase upon the disappearance of the a-c voltage and in the event of any change in its phase is provided.

What is claimed is:

1. A circuit arrangement for storing the phase of an a-c voltage, comprising:
  (a) one monostable multivibrator which provides at its output a square wave pulse train corresponding to the positive half waves of the a-c voltage;

(b) a further monostable multivibrator which provides at its output a further squarewave pulse train corresponding to the negative half waves of the a-c voltage;

(c) one logic circuit coupling the output of said further monostable multivibrator to the input of said one monostable multivibrator;

(d) a further logic circuit coupling the output of said one monostable multivibrator to the input of said further monostable multivibrator;

(e) means coupling pulses corresponding to the negative half waves of the a-c voltage to said one logic circuit and pulses corresponding to the negative half waves of the a-c voltage to said further logic circuit; and (f) a control arrangement which is controlled by the a-c voltage having outputs coupled to said logic circuits to control said logic circuits to pass said half wave pulses during normal operation and, in the event of a phase change to pass squarewave pulses at the outputs of said monostable multivibrators to the inputs of said monostable multivibrators.

2. A circuit arrangement according to claim 1, wherein:

(a) each of said logic circuits comprises two AND gates and an OR gate, having as inputs and outputs of said two AND gates;

(b) the pulses corresponding to the negative half waves of the a-c voltage are applied to one input of one AND gate of the one logic circuit and pulses corresponding to the positive half waves of the a-c voltage are applied to one input of one AND gate of the further logic circuit;

(c) one output of the control arrangement is coupled to the other inputs of the respective one AND gates;

(d) one input of each of the respective other AND gates is coupled to a further output of the control arrangement; and (e) the other inputs of the respective other AND gates are connected to the outputs of the respective monostable multivibrators.

3. A circuit arrangement according to claim 2, and further including a monitoring circuit receiving the a-c voltage at its input and having its output coupled to said control arrangement and providing a control signal to the control arrangement if the phase of the a-c voltage present at its input changes.

4. A circuit arrangement according to claim 3, wherein said monitoring circuit comprises:

(a) an additional monostable multivibrator which delivers at its output said pulses corresponding to the negative half wave of the a-c voltage;

(b) a further additional monostable multivibrator which generates at its output the further pulses corresponding to the positive half wave of the a-c voltage; and (c) a coincidence stage having the outputs of said additional monostable multivibrators as inputs and having its output coupled to an input of said control arrangement.

5. A circuit arrangement according to claim 4, wherein the output of the one additional monostable multivibrator is coupled to the one input of the one AND gate of the one logic circuit and the output of the further additional monostable multivibrator is coupled to the one input of the one AND gate of the further logic circuit.

6. A circuit arrangement according to claim 5 wherein said control arrangement includes a bistable multivibrator, the two outputs of which are coupled to the AND gates of the logic circuits.

7. A circuit arrangement according to claim 6 wherein said control arrangement includes a time determining monostable multivibrator at its input and providing an output to one input of said bistable multivibrator.

8. A circuit arrangement according to claim 7, and further including an additional OR gate coupling the outputs of said two additional monostable multivibrators to the other input of said bistable multivibrator.

* * * * *